(12) United States Patent
Jacques et al.

(10) Patent No.: US 7,811,942 B2
(45) Date of Patent: Oct. 12, 2010

(54) TRI-LAYER PLASMA ETCH RESIST REWORK

(75) Inventors: Jeannette Michelle Jacques, Rowlett, TX (US); Yong Seok Choi, Mckinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 591 days.

(21) Appl. No.: 11/843,361

(22) Filed: Aug. 22, 2007

(65) Prior Publication Data

US 2009/0050604 A1 Feb. 26, 2009

(51) Int. Cl.
*H01L 21/302* (2006.01)
*H01L 21/461* (2006.01)

(52) U.S. Cl. .......................... 438/725; 216/47; 216/67; 438/694; 430/270.1

(58) Field of Classification Search .................... 216/41, 216/47, 67; 438/694, 725, 699, 717
See application file for complete search history.

(56) References Cited

U.S. PATENT DOCUMENTS 6,475,707 B2* 11/2002 Yu ............................. 430/325

* cited by examiner

*Primary Examiner*—Roberts Culbert
(74) *Attorney, Agent, or Firm*—Warren L. Franz; Wade J. Brady, III; Frederick J. Telecky, Jr.

(57) ABSTRACT

Exemplary embodiments provide a tri-layer resist (TLR) stack used in a photolithographic process, and methods for resist reworking by a single plasma etch process. The single plasma etch process can be used to remove one or more portions/layers of the TLR stack that needs to be reworked in a single process. The removed portions/layers can then be re-formed and resulting in a reworked TLR stack for subsequent photo-resist (PR) processing. The disclosed plasma-etch resist rework method can be a fast, simple, and cost effective process used in either single or dual damascene tri-layer patterning processes for the fabrication of, for example, sub 45-nm node semiconductor structures.

21 Claims, 4 Drawing Sheets

TRI-LAYER PLASMA ETCH RESIST REWORK

FIELD OF THE INVENTION

This invention relates generally to semiconductor devices and methods for their manufacture and, more particularly, to semiconductor rework processes during photolithography.

BACKGROUND OF THE INVENTION

Photolithography is often a critical step in the fabrication of semiconductor devices, and has become more complicated due to the rapidly-shrinking dimensions of the semiconductor devices. In a photolithographic process, the accuracy and reliability of a patterned photoresist (PR) layer plays an important role in device performance. For example, when a patterned PR layer is found to have defects (e.g., from misalignment, from over-etching, and/or remnants on the surface of patterned PR layer), instead of proceeding to an etching process, a manufacturer would normally have the patterned PR layer reworked to prevent permanent damage to the entire batch of chips in subsequent processes.

Generally, a multi-layer (photo-) resist process can be used to improve photolithographic pattern transfer performance. For example, the multi-layer resist process can be a tri-layer resist process including a tri-layer resist (TLR) stack that has, for example, a PR layer on a SOG (spin-on glass) layer on an under-layer. One conventional method for resist reworking includes removing the incorrectly developed PR layer from the silicon chip by solvents (e.g., chemical wet etching). Since the incorrect PR layer has already been cured and bombarded, solvent rework often leaves residues and results in changes of SOG thickness, resist footing behavior, and/or refractive indices. In addition, solvent rework can be used to remove only the resist layer in a single process. Another conventional method for resist reworking can include an ash rework, which can be used to remove the PR layer and/or the under-layer (UL) but cannot remove the SOG layer of the tri-layer resist stack. Consequently, the solvent and/or ash rework process can only be used to remove a certain portion of the tri-layer resist stack in a single process. Therefore, multiple processing steps on multiple tools may be needed in order to remove, e.g., a full TLR stack.

Thus, there is a need to overcome these and other problems of the prior art and to provide a flexible technique for resist reworking by removing any desired portions of the tri-layer resist stack in a single process.

SUMMARY OF THE INVENTION

According to various embodiments, the present teachings include a resist rework method. In this method, a tri-layer resist stack, including a resist layer formed on an intermediate layer formed on an under-layer, can be formed on a substrate. A single plasma etch process can then be performed to remove one or more layers of the resist layer, the intermediate layer, and the under-layer. Each plasma-etched layer of the tri-layer resist stack can thereafter be reformed.

According to various embodiments, the present teachings also include a resist rework method. In this method, a tri-layer resist stack, including a photoresist layer formed on a SOG layer that is formed on an under-layer, can be formed on a substrate. The photoresist layer and the SOG layer can then be plasma-etched in a single process and the under-layer can be exposed. On the exposed under-layer, a second SOG layer can be formed, followed by a formation of a second resist layer on the second SOG layer.

According to various embodiments, the present teachings further include a resist rework method. In this method, a tri-layer resist stack, including a photoresist layer formed on a SOG layer that is formed on an under-layer, can be formed on a substrate. Each layer of the tri-layer resist stack can then be plasma-etched in a single process and exposing the substrate. On the exposed substrate, a second tri-layer resist stack can be formed by forming a second under-layer on the exposed substrate; forming a second SOG layer on the second under-layer; and forming a second resist layer on the second SOG layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
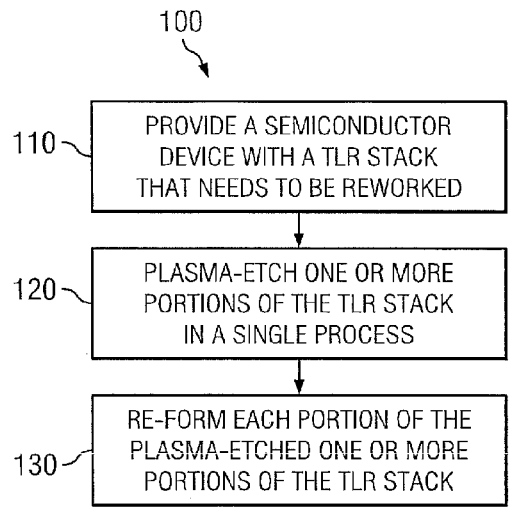
FIG. 1 depicts an exemplary resist rework method in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide a tri-layer resist (TLR) stack used in a photolithographic process, and methods for resist reworking by a single plasma etch process. The single plasma etch process can be used to remove one or more portions/layers of the TLR stack that needs to be reworked in a single process. The removed portions/layers can then be re-formed and resulting in a reworked TLR stack for subsequent photoresist (PR) processing. The disclosed plasma-etch resist rework method can be a fast, cheap, and simple process used in either single or dual damascene tri-layer patterning processes for the fabrication of, for example, sub 45-nm node semiconductor structures.

Depending on the portions/layers being etched, the single plasma etch process can be performed using various processing gases and parameters. The various processing gases can include one or more gases chosen from, for example, oxygen, nitrogen, chlorine, bromine, hydrogen, fluorinated gases, and carbon dioxide. The various processing parameters can include, for example, pressure, temperature, gas flow, and the power. In an exemplary embodiment, the single plasma etch process can be conducted at a pressure ranging from about 10 mtorr to about 300 mtorr and at a temperature ranging from about −20° C. to about 90° C. The plasma etching can be, for example, a timed etch, including a timed etch with a built-in percentage for over etch, and/or an endpoint etch, including an endpoint with a built-in percentage for over etch.

FIG. 1 depicts an exemplary resist rework method 100 in a photolithographic process in accordance with the present teachings. At 110, in a manufacturing process of a semiconductor device, a tri-layer resist (TLR) stack that needs to be reworked can be formed on a semiconductor substrate. In an exemplary embodiment, the TLR stack can have a failed resist pattern formed (i.e., developed) on an intermediate layer (e.g., a SOG layer) that is formed on an under-layer (e.g., an organic under coat). The failed resist pattern means, for example, a resist pattern whose size is out of specification, or a resist pattern in which pattern deviation is generated.

At 120, the resist rework process can be performed by plasma-etching away one or more layers, e.g., wholly or in part for each layer, of the TLR stack, depending on the extent that the TLR stack needs to be reworked. That is, the plasma etch process can be used to remove any desired portions of the tri-layer resist stack in a single process.

At 130, the plasma-removed each portion of the tri-layer resist stack can be re-formed over the semiconductor substrate to form a second (also referred to herein as "a new", "a reformed" or "a reworked") TLR stack. The removal process at 120 and the reformation process at 130 can be repeated as desired until a corrected PR layer is formed for subsequent exposure and PR development.

In a first exemplary embodiment, the failed resist pattern of the tri-layer resist stack can be removed by the disclosed single plasma etch process. Thereafter, a second (also referred to herein as "a new", "a reformed" or "a reworked") PR layer can be formed.

In a second exemplary embodiment, another portion of the tri-layer resist stack, including the failed resist pattern and the underlying intermediate layer (e.g., the SOG layer), can be removed by the single plasma etch process. The single plasma etch process of each layer of the failed resist pattern and the intermediate layer can be controlled by, for example, etch time or etch end-point. Thereafter, for example, a new/reworked SOG layer can be formed on the under-layer (UL) and a new PR layer can be reformed on the reworked SOG layer. In various embodiments, a portion of the underlying UL can also be removed during the single plasma etch process.

In a third exemplary embodiment, a third portion of the tri-layer resist stack, including the failed PR pattern, the underlying exemplary SOG layer and the UL layer underlain the SOG layer, can be removed by the disclosed single plasma etch process. The single plasma etch process of each layer of the third portion can be controlled by etch time or etch end-point. In various embodiments, the UL layer can be removed wholly or in part from the underlying featured semiconductor substrate. For example, the UL layer can be removed completely from the feature structure of the semiconductor substrate and leaving, for example, a trench structure. Alternatively, the UL layer can be removed partially, for example, without removing the portion in the trench feature of the semiconductor substrate. Following the removal of the third portion of the TRL stack, a new UL layer can be re-formed on the semiconductor substrate followed by the formation of a new SOG layer on the re-formed UL layer, and a new PR layer re-formed on the reworked SOG layer, resulting in a reworked TRL stack.

Figure 2:
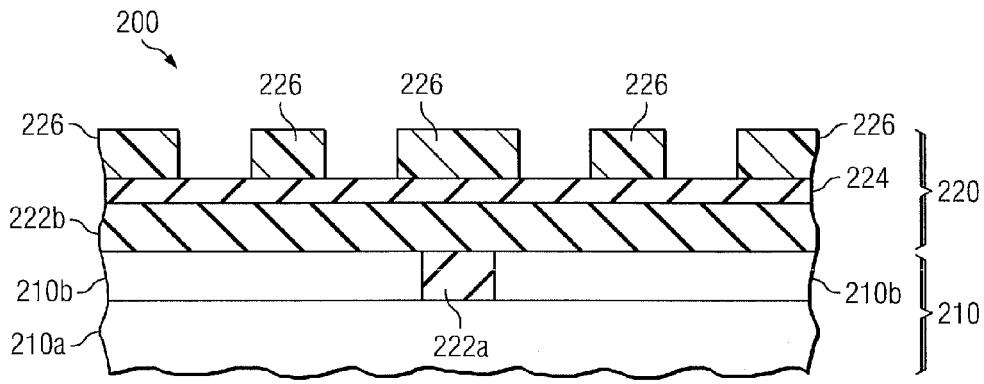
FIG. 2 depicts an exemplary semiconductor device including a tri-layer resist (TLR) stack suitable for use in accordance with the present teachings.

FIG. 2 depicts an exemplary semiconductor device 200 including a tri-layer resist (TLR) stack suitable for use in accordance with the present teachings. It should be readily apparent to one of ordinary skill in the art that the device 200 depicted in FIG. 2 represents a generalized schematic illustration and that other layers/structures can be added or existing layers/structures can be removed or modified.

The device 200 can be processed in, for example, a single or dual damascene tri-layer patterning. In an exemplary embodiment as shown in FIG. 2, the device 200 can include a semiconductor substrate 210 including a substrate base layer 210a and a substrate process layer 210b, and a TLR stack 220 that includes an under-layer 222, an intermediate layer 224, and a patterned PR layer 226.

The semiconductor substrate 210 can include the substrate process layer 210b formed on the substrate base layer 210a. The substrate base layer 210a can be an ordinary semiconductor substrate, for example, a Si substrate. The substrate process layer 210b can include a dielectric material, for example, an ultra-low K material chosen from fluorinated silicon dioxide (SiOF), silicon oxycarbide (SiOC), hydrogenated silicon carbide (SiCOH), silicon carbon nitride (SiCN), and/or silicon oxycarbonitride (SIOCN). For example, the ultra-low K material can be a porous SiCOH with a porosity ranging from about 7% to about 50%. In an exemplary embodiment, the substrate process layer 210b can also provide a feature structure by design. For example, a trench can be formed in the substrate process layer 210b. In various embodiments, additional dielectric capping materials (not shown), for example, silicon oxide or silicon nitride, can be formed (e.g., deposited) on the substrate process layer 210b to protect the ultra-low K material form damage during subsequent rework process of the TLR stack. Alternatively, a thicker ultra-low K material can be deposited to provide a damage bumper layer during the plasma removal. The damage bumper layer can thereafter be removed by a surface polishing process, for example, a chemical mechanical polishing process.

The TLR stack 220 can be formed on the semiconductor substrate 210, specifically, on the process layer 210b. In the TLR stack 220, the patterned PR layer 226 can be formed on the intermediate layer 224, which can be formed on the under-layer 222.

The patterned PR layer 226 can have a failed PR pattern on the intermediate layer 224. The intermediate layer 224 can be a Si-bearing intermediate layer including, for example, a SOG layer. The SOG layer can have a thin layer of $SiO_2$ (often doped) deposited on the sub-surface by a spin-on process. The under-layer (UL) 222 can be an organic film coated on the surface of the substrate process layer 210b to provide, for example, anti-reflective and/or etch-durable properties. In various embodiments, the substrate process layer 210b can have one or more feature structures. The UL 222 can therefore include multiple layers depending on the manufacturing design of the semiconductor device 200. For example, the UL layer 222 can include a first portion (e.g., layer) 222a formed into the feature structure (e.g., a trench shown in FIG. 2) of the semiconductor substrate 210. The UL layer 222 can also include a second portion (layer) 222b formed on each surface of the process layer 210b and the first portion 222a as shown in FIG. 2.

FIGS. 3A-3B, FIGS. 4A-4C, FIGS. 5A-5C and FIGS. 6A-6D depict various exemplary resist rework processes on the semiconductor device 200 using the disclosed single plasma etch process. In various embodiments, multiple rework processes can be performed until a correct PR pattern is formed. Standard PR processing such as patterning (e.g., coat/exposure/development) and etching of the reworked PR layer can thereafter be performed.

Figure 3A:
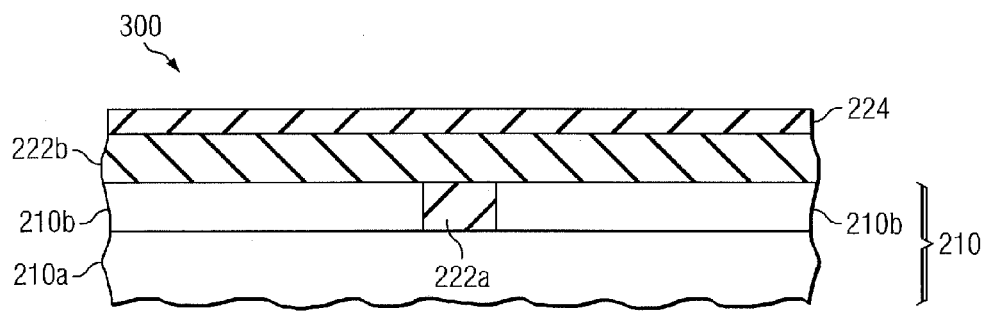
FIGS. 3A-3B depict a first exemplary resist rework process in accordance with the present teachings.
Figure 3B:
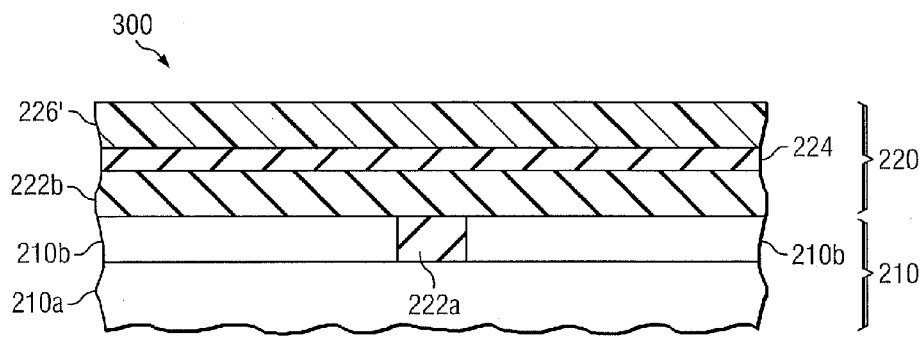

FIGS. 3A-3B depict a first exemplary resist rework process 300 on the semiconductor device 200 shown in FIG. 2 in accordance with the present teachings. As shown in FIG. 3A, the process 300 can include a single plasma removing of the patterned PR layer 226 (see FIG. 2) and exposing the intermediate layer 224. The patterned PR layer 226 can be removed by a single plasma etching with, for example, a gas of oxygen, or hydrogen-nitrogen.

In FIG. 3B, following the removal of the failed patterned PR layer 226, a new PR layer 226' can be deposited or spun on the exposed intermediate layer 224. Standard photolithographic processes (not shown) such as patterning and etching of the PR layer 226' can then be performed.

Figure 4A:
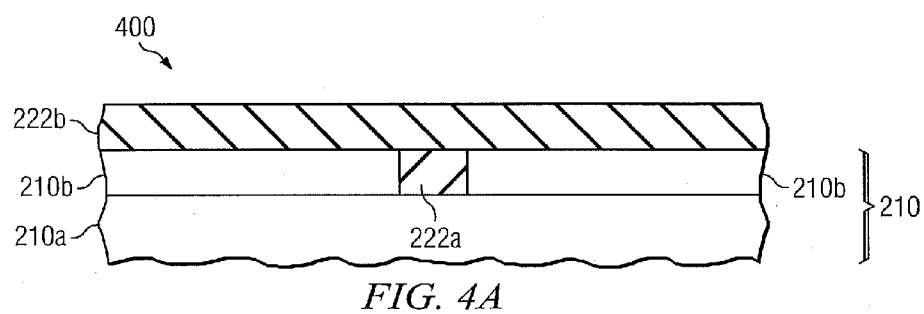
FIGS. 4A-4C depict a second exemplary resist rework process in accordance with the present teachings.
Figure 4B:
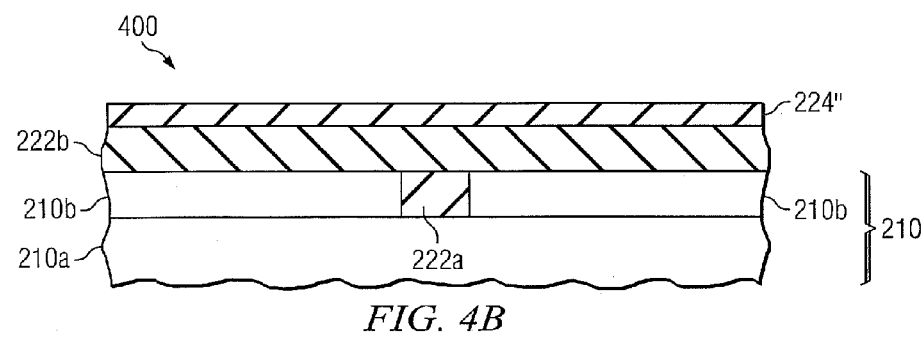
Figure 4C:
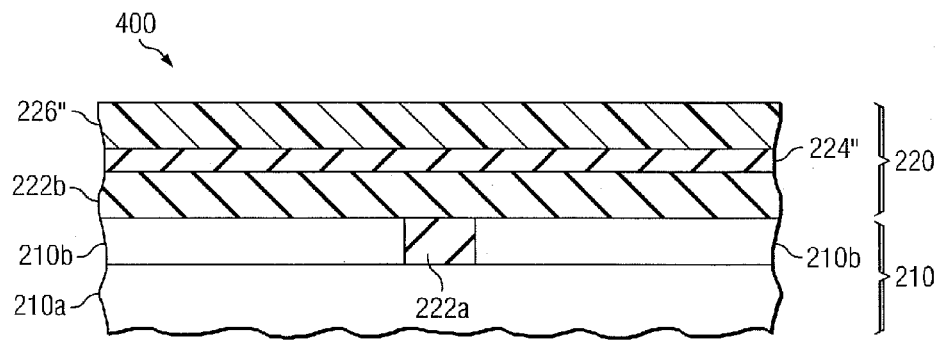

FIGS. 4A-4C depict a second exemplary resist rework process 400 in accordance with the present teachings. As shown in FIG. 4A, the process 400 can include a single removing of a two-layer structure of the TLR stack, including the failed patterned PR layer 226 and the underlying intermediate layer 224, from the UL 222 of the semiconductor device 200 shown in FIG. 2. This single removing can be performed by the disclosed plasma etch process. In various embodiments, a portion of the underlying UL 222b can also be consumed and the plasma etch can be adjusted for a slightly thinner UL layer by using, for example, a timed etch with a built-in percentage for over etch, or an endpoint etch with a built-in percentage for over etch according to various manufacturing processes. In some cases, the UL layer 222b can be largely consumed with a loss of thickness that impacts the etch process (e.g., critical dimension (CD) size and/or CD uniformity). A second under-layer (not shown) can be formed on the largely consumed UL 222b with a total final UL thickness ranging from about 250 nm to about 350 nm.

Following the single removal of the two-layer structure (i.e., the failed patterned PR layer 226 and the intermediate layer 224), a reworked two-layer structure can be formed on the UL 222b. For example, in FIG. 4B, a new intermediate layer 224" can be first formed (e.g., deposited or spun) on surface of the exposed UL 222b (see FIG. 4A), followed by a formation of a new PR layer 226" (see FIG. 4C) deposited or spun on the re-formed intermediate layer 224". Standard PR processes (not shown) such as patterning and etching of the reworked PR layer 226" can then be performed.

Figure 5A:
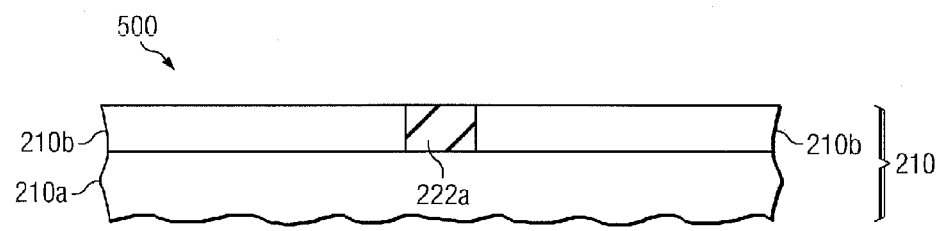
FIGS. 5A-5C depict a third exemplary resist rework process in accordance with the present teachings.
Figure 5B:
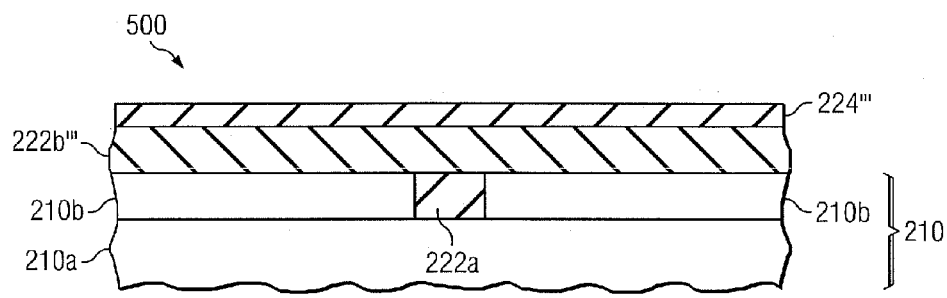
Figure 5C:
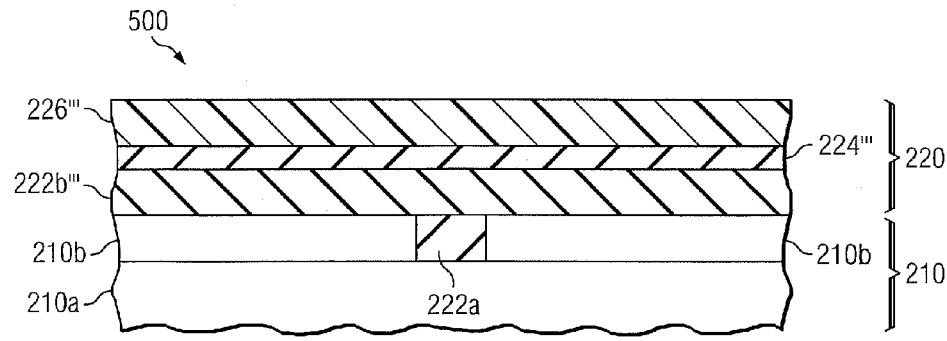

FIGS. 5A-5C depict a third exemplary resist rework process 500 in accordance with the present teachings. As shown in FIG. 5A, the process 500 can include a single plasma removing of a three-layer structure of the TLR stack from the semiconductor device 200 shown in FIG. 2. The 3-layer structure can include the failed patterned PR layer 226 formed on the intermediate layer 224 on the second UL portion/layer 222b.

Following the single removal of the 3-layer structure of the failed patterned PR layer 226 on the intermediate layer 224 on the first UL portion/layer 222b, a reworked 3-layer structure can be formed. For example, in FIG. 5B, a new UL 222b''' can be formed on each surface of the substrate process layer 210b and the first UL portion/layer 222a, followed by a formation of a new intermediate layer 224''' formed (e.g., deposited or spun) on the new UL 222b'''. In FIG. 5C, a new (i.e., reworked) PR layer 226''' can then be formed on the re-formed intermediate layer 224'''.

Figure 6A:
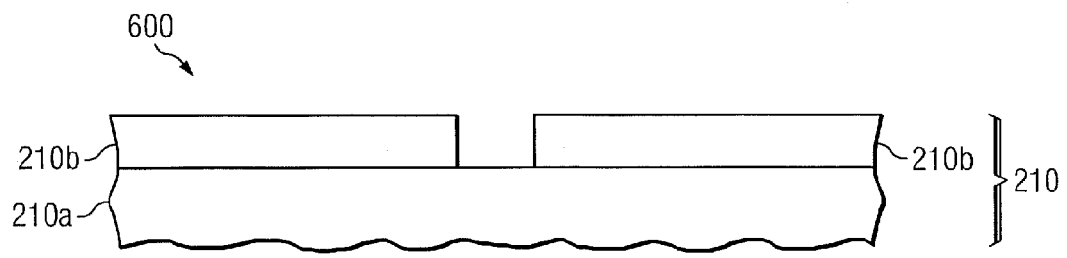
FIGS. 6A-6D depict a forth exemplary resist rework process in accordance with the present teachings.
Figure 6B:
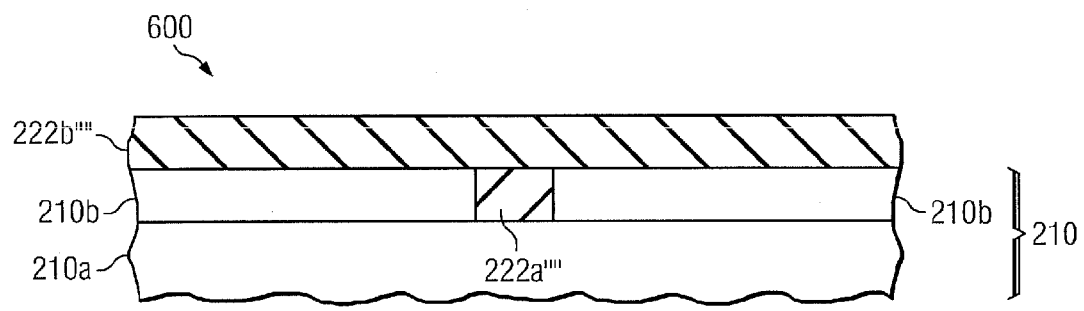
Figure 6C:
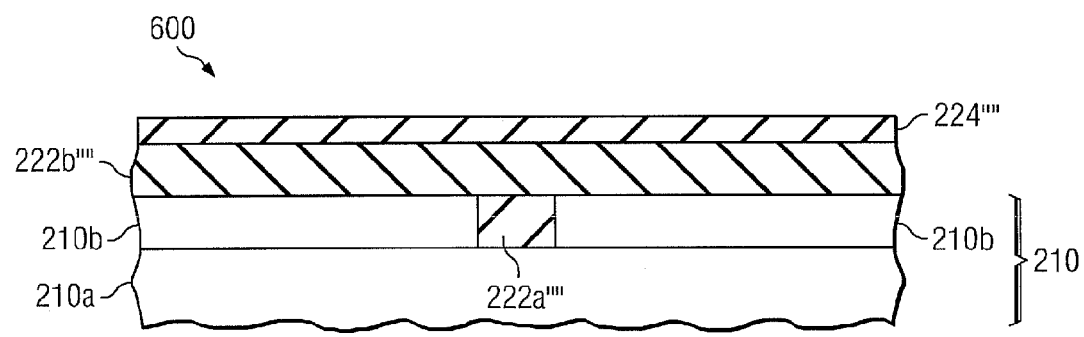
Figure 6D:
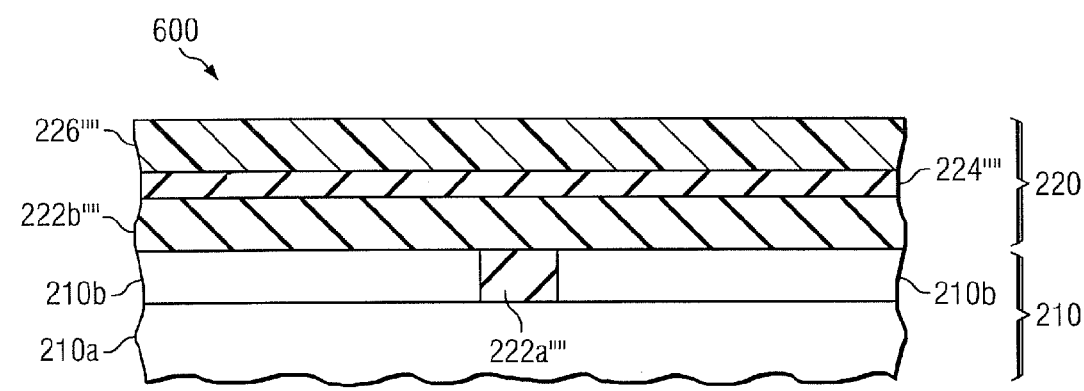

FIGS. 6A-6D depict a forth exemplary resist rework process 600 in accordance with the present teachings. As shown in FIG. 6A, the process 600 can include a single removing of the full TLR stack including the failed patterned PR layer 226, the intermediate layer 224, and the full under-layer 222a-b, from the semiconductor device 200 shown in FIG. 2. This single removing can be performed by the disclosed plasma etch process.

Following the single removal (see FIG. 6A) of the full TLR stack from the substrate process layer 210b, a reworked full TLR stack can be formed. For example, new layers 222a'''' and 222b'''' can be formed on the substrate process layer 210b (see FIG. 6B), followed by a formation of a new intermediate layer 224'''' (see FIG. 6C) formed (e.g., deposited or spun) on the new UL 222b''''. A new (or reworked) PR layer 226'''' (see FIG. 6D) can then be formed on the re-formed intermediate layer 224''''.

After the exemplary rework processes shown in FIGS. 1-6, standard PR processing such as patterning (e.g., coat/exposure/development) and etching of the new (i.e., reworked, or corrected) PR layer can be performed on the semiconductor devices, for example, the device shown in FIG. 3B, FIG. 4C, FIG. 5C and FIG. 6D. For PR processing, firstly, the pattern circuit area, i.e., the reworked PR layer, can be exposed, baked, and developed, and whereby forming a resist pattern (not shown) on the reworked PR layer (e.g., 226', 226", 226''', or 226''''). Secondly, the intermediate layer (e.g., 224, 224", 224''', or 224'''') and the second under-layer (222b, 222b''' or 222b'''') can be etched using the resist pattern of the reworked PR layer as a mask to transfer the resist pattern to the intermediate layer and the second UL layer. At this time, the PR layer can also be etched and removed. In various embodiments, the pattern can then be transferred to the substrate 210 (e.g., the process layer 210b) by etching the substrate 210 using the stacked patterned intermediate layer and the UL layer as a mask. As a result, the pattern can be formed on the substrate 210.

In this manner, the disclosed plasma-etch resist rework processes can be used to provide a high-quality substrate by preventing transferring a failed pattern (e.g., a deviated resist pattern) down to the substrate. In addition, by using the single plasma etch process, more rework options can be provided in a single process due to the wide range of the processing gases and parameters. Further, the disclosed resist rework process can be a cost effective, fast and simple process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A resist rework method comprising:
   providing a tri-layer resist stack on a substrate, wherein the tri-layer resist stack comprises a resist layer formed on an intermediate layer that is formed on an under-layer;
   plasma-etching the resist layer and the intermediate layer in a single process and exposing the under-layer; and
   re-forming each plasma-etched layer of the tri-layer resist stack, including:
      forming a second intermediate layer on the exposed under-layer; and
      forming a second resist layer on the second intermediate layer.

2. A resist rework method comprising:
   providing a tri-layer resist stack on a substrate, wherein the tri-layer resist stack comprises a resist layer formed on an intermediate layer that is formed on an under-layer;
   plasma-etching the tri-layer resist stack in a single process and exposing the substrate; and
   re-forming each layer of the plasma-etched tri-layer resist stack, including:
      forming a second under-layer on the exposed substrate;
      forming a second intermediate layer on the second under-layer; and
      forming a second resist layer on the second intermediate layer.

3. A resist rework method comprising:
   providing a tri-layer resist stack on a substrate, wherein the tri-layer resist stack comprises a resist layer formed on an intermediate layer that is formed on an under-layer;
   plasma-etching one or more layers of the resist layer, the intermediate layer, and the under-layer in a single process; and
   re-forming each plasma-etched layer of the tri-layer resist stack;
   wherein the under-layer further comprises a first under-layer formed in a trench of the substrate and a second under-layer formed on each surface of the substrate and the first under-layer.

4. The method of claim 3, further comprising:
   plasma-etching the resist layer, the intermediate layer and the second under-layer in a single process and exposing the substrate and the first under-layer;
   re-forming a second under-layer on the exposed substrate and the exposed first under-layer;
   re-forming an intermediate layer on the re-formed second under-layer; and
   re-forming a resist layer on the re-formed intermediate layer.

5. The method of claim 3, further comprising:
   plasma-etching the tri-layer stack comprising the resist layer, the intermediate layer, the second under-layer and the first under-layer in a single process and exposing the substrate comprising a trench;
   re-forming a first under-layer in the trench of the substrate;
   reforming a second under-layer on each surface of the substrate and the re-formed first under-layer;
   re-forming an intermediate layer on the re-formed second under-layer; and
   re-forming a resist layer on the re-formed intermediate layer.

6. A resist rework method comprising:
   providing a tri-layer resist stack on a substrate, wherein the tri-layer resist stack comprises a resist layer formed on an intermediate layer that is formed on an under-layer, and wherein the intermediate layer comprises a SOG (spin-on glass);
   plasma-etching one or more layers of the resist layer, the intermediate layer, and the under-layer in a single process; and
   re-forming each plasma-etched layer of the tri-layer resist stack.

7. The method of claim 6, further comprising patterning and etching a re-formed resist layer of the tri-layer resist stack.

8. The method of claim 6, further comprising:
   plasma-etching the resist layer in a single process and exposing the intermediate layer; and
   forming a second resist layer on the exposed intermediate layer.

9. The method of claim 6, wherein the plasma-etching uses one or more gases selected from the group consisting of oxygen, nitrogen, chlorine, bromine, hydrogen, fluorinated gas, and carbon dioxide.

10. The method of claim 6, wherein the plasma-etching is performed under a pressure ranging from about 10 mTorr to about 300 mTorr.

11. The method of claim 6, wherein the plasma etching is performed at a temperature ranging from about −20° C. to about 90° C.

12. The method of claim 6, wherein the plasma-etching is controlled by an etch time or an etch end-point.

13. A resist rework method comprising:
   providing a tri-layer resist stack on a substrate, wherein the tri-layer resist stack comprises a resist layer formed on an intermediate layer that is formed on an under-layer, and wherein the under-layer comprises an organic film;
   plasma-etching one or more layers of the resist layer, the intermediate layer, and the under-layer in a single process; and
   re-forming each plasma-etched layer of the tri-layer resist stack.

14. A resist rework method comprising:
   providing a tri-layer resist stack on a substrate, wherein the tri-layer resist stack comprises a resist layer formed on an intermediate layer that is formed on an under-layer, wherein the substrate comprises an ultra-low K material formed on a silicon substrate, and wherein the ultra-low K material is selected from the group consisting of fluorinated silicon dioxide (SiOF), silicon oxycarbide (SiOC), hydrogenated silicon carbide (SiCOH), silicon carbon nitride (SiCN), and silicon oxycarbonitride (SIOCN);

plasma-etching one or more layers of the resist layer, the intermediate layer, and the under-layer in a single process; and re-forming each plasma-etched layer of the tri-layer resist stack.

15. The method of claim 14, wherein the substrate further comprises a dielectric capping layer formed on the ultra-low K material for protecting the ultra-low K material during the plasma-etching.

16. A resist rework method comprising:
providing a tri-layer resist stack on a substrate, wherein the tri-layer resist stack comprises a photoresist layer formed on a SOG layer that is formed on an under-layer;
plasma-etching the photoresist layer and the SOG layer in a single process and exposing the under-layer;
forming a second SOG layer on the exposed under-layer; and
forming a second resist layer on the second SOG layer.

17. The method of claim 16, wherein the plasma etching further comprises etching a portion of the under-layer and exposing the etched under-layer.

18. The method of claim 17, further comprising depositing a second under-layer on the exposed etched under-layer before the formation of the second SOG layer.

19. The method of claim 18, wherein the second under-layer and the etched under-layer have a total thickness ranging from about 250 nm to about 350 nm.

20. A resist rework method comprising:
providing a tri-layer resist stack on a substrate, wherein the tri-layer resist stack comprises a photoresist layer formed on a SOG layer that is formed on an under-layer;
plasma-etching each layer of the tri-layer resist stack in a single process and exposing the substrate; and
forming a second tri-layer resist stack on the exposed substrate by
forming a second under-layer on the exposed substrate,
forming a second SOG layer on the second under-layer, and
forming a second resist layer on the second SOG layer.

21. The method of claim 20, further comprising a capping layer formed on the substrate for protecting the substrate, wherein the capping layer comprises a material selected from the group consisting of silicon oxide, and silicon nitride.

* * * * *